United States Patent
Hellings et al.

(10) Patent No.: US 9,847,336 B2
(45) Date of Patent: Dec. 19, 2017

(54) METHOD OF FORMING A JUNCTION FIELD EFFECT TRANSISTOR

(71) Applicant: IMEC VZW, Leuven (BE)

(72) Inventors: Geert Hellings, Halle (BE); Geert Van der Plas, Leuven (BE); Mirko Scholz, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/245,671

(22) Filed: Aug. 24, 2016

(65) Prior Publication Data

US 2017/0062431 A1    Mar. 2, 2017

(30) Foreign Application Priority Data

Aug. 24, 2015  (EP) .................................. 15182155

(51) Int. Cl.
*H01L 27/092* (2006.01)
*H01L 21/266* (2006.01)
(Continued)

(52) U.S. Cl.
CPC ...... *H01L 27/0928* (2013.01); *H01L 21/0332* (2013.01); *H01L 21/265* (2013.01);
(Continued)

(58) Field of Classification Search
CPC ............. H01L 27/0928; H01L 27/0629; H01L 21/0332; H01L 21/266; H01L 29/66893; H01L 29/808
(Continued)

(56) References Cited

U.S. PATENT DOCUMENTS 4,173,063 A * 11/1979 Kniepkamp ...... H01L 21/26546
148/DIG. 100
4,912,053 A * 3/1990 Schrantz .................. H01L 21/82
257/274
(Continued)

FOREIGN PATENT DOCUMENTS

JP   2000-164724 A      6/2000
JP    2000164724 A  *   6/2000

OTHER PUBLICATIONS

European Search Report dated Mar. 10, 2016 in European Application No. 15182155.0.

*Primary Examiner* — Cuong Q Nguyen
*Assistant Examiner* — Tong-Ho Kim
(74) *Attorney, Agent, or Firm* — Knobbe, Martens, Olson & Bear LLP

(57) ABSTRACT

The disclosed technology relates to semiconductors, and more particularly to a junction field effect transistor (JFET). In one aspect, a method of fabricating a JFET includes forming a well of a first dopant type in a substrate, wherein the well is isolated from the substrate by an isolation region of a second dopant type. The method additionally includes implanting a dopant of the second dopant type at a surface of the well to form a source, a drain and a channel of the JFET, and implanting a dopant of the first dopant type at the surface of the well to form a gate of the JFET. The method additionally includes, prior to implanting the dopant of the first type and the dopant of the second type, forming a pre-metal dielectric (PMD) layer on the well and forming contact openings in the PMD layer above the source, the drain and the gate. The PMD layer has a thickness such that the channel is formed by implanting the dopant of the first type and the dopant of the second type through the PMD layer. The method further includes, after implanting the dopant of the first type and the dopant of the second type, siliciding the source, the drain and the gate, and forming metal contacts in the contact openings.

16 Claims, 8 Drawing Sheets

(51) Int. Cl.
*H01L 27/06* (2006.01)
*H01L 21/033* (2006.01)
*H01L 29/808* (2006.01)
*H01L 29/66* (2006.01)
*H01L 21/265* (2006.01)
*H01L 21/761* (2006.01)
*H01L 29/10* (2006.01)
H01L 29/45 (2006.01)
H01L 29/861 (2006.01)

(52) U.S. Cl.
CPC .......... *H01L 21/266* (2013.01); *H01L 21/761* (2013.01); *H01L 27/0629* (2013.01); *H01L 29/1058* (2013.01); *H01L 29/66893* (2013.01); *H01L 29/66901* (2013.01); *H01L 29/808* (2013.01); *H01L 29/456* (2013.01); *H01L 29/66128* (2013.01); *H01L 29/8611* (2013.01)

(58) Field of Classification Search
USPC .......................................... 257/274; 438/220
See application file for complete search history.

(56) References Cited

U.S. PATENT DOCUMENTS

| | | | | |
|---|---|---|---|---|
| 5,468,681 A | * | 11/1995 | Pasch | G03F 7/70433 156/329 |
| 5,972,745 A | * | 10/1999 | Kalter | H01L 21/82389 257/E21.345 |
| 2006/0151806 A1 | * | 7/2006 | Fukuda | H01L 21/0445 257/155 |

* cited by examiner

METHOD OF FORMING A JUNCTION FIELD EFFECT TRANSISTOR

CROSS-REFERENCE TO RELATED APPLICATIONS

This application claims foreign priority to European Application No. 15182155.0, filed Aug. 24, 2015, the content of which is incorporated by reference herein in its entirety.

BACKGROUND

Field

The disclosed technology generally relates to semiconductors, and more particularly to a method for forming a junction field effect transistor (JFET).

Description of the Related Technology

Fabrication of semiconductor devices, e.g., transistors, involves various processes including deposition, diffusion, doping, lithography and etch, among other processes. Likewise, fabrication of a junction field effect transistor (JFET) involves a number of processes, including, e.g., creation of a well, formation of a source, a drain and a gate by dopant implantation, and formation of contacts, among other processes. At least some of these processes follow a patterning process using a lithographic mask, for example, for covering the substrate except for regions into which dopants are subsequently implanted to form the source and drain. The number of masks used in the fabrication depends, e.g., on the complexity and size of the JFET, and/or the type of electronic chip in which the JFET is being integrated.

In many integrated circuit (IC) fabrication process flows, it is becoming increasingly desirable to reduce or minimize the number of masks used, whose number is inversely proportional to the processing cost. One example area of such fabrication process flows includes fabrication process flows for integrating interposer chips. Interposer chips refer to silicon substrates used as an interface between a carrier substrate and one or more ICs. Interposers play an important role in present day IC packaging solutions. Some interposers are passive interposers, which carry the ICs and connect them to the carrier substrate using through silicon via (TSV) connections. Some interposers are active interposers, which are provided with a number of active devices produced on the interposer by a front-end-of-line type process. Integrating more active devices on the interposer is, however, increasingly difficult without increasing the complexity and cost of the process steps applied for this purpose. Thus, there is a need for fabrication process flows for integrating interposer chips using reduced number of masks.

SUMMARY OF CERTAIN INVENTIVE ASPECTS

The disclosed technology is related to a method for forming a JFET as disclosed in the appended claims. The disclosed method allows for fabrication of a JFET on a substrate using a limited number of lithographic masks and is therefore useful in the production of interposer chips provided with active devices.

The disclosed technology is firstly related to a method for forming a junction field effect transistor on a semiconductor substrate, comprising the steps of:
providing a semiconductor substrate,
forming a well of a first doping type in the substrate, the well being isolated from the substrate by material of a second doping type that is opposite to the first type, the surface of the well comprising the following areas for defining the JFET: a source area, a drain area, a channel area extending between the source and drain areas, and a gate area,
implanting dopant elements of the second type in the source area, the drain area and the channel area, thereby forming a source, a drain and a channel of the JFET,
implanting dopant elements of the first type in the gate area, thereby forming a gate of the JFET,
depositing a pre-metal dielectric layer on the well,
forming contact openings in the PMD layer above the source, drain and gate areas,
after the implanting steps, performing silicidation of the source, drain and gate, and forming metal contacts in the contact openings,
characterized in that:
the steps of depositing a PMD layer and forming contact openings precede the implanting steps and
the thickness of the PMD layer is configured so that the channel is created by implanting dopant elements through the PMD layer.

According to an embodiment, the thickness of the PMD layer is chosen as a function of the gate voltage at which the JFET is to be substantially off.

According to an embodiment, one or more additional wells of the first doping type, the additional wells being isolated from the substrate by material of a second doping type, are produced simultaneously with the well in which the JFET is produced, and additional devices are produced in the additional wells, together with the JFET, in a single process sequence. The additional devices may comprise at least a surface diode. The semiconductor substrate may be an interposer substrate.

According to a further embodiment of the disclosed method, four lithographic masks are used consecutively for forming the JFET:
a first mask suitable for forming a first resist mask on the substrate defining an exposed area in which to create the well,
a second mask suitable for forming a second resist mask on the PMD layer, defining exposed areas in which to create the contact openings,
a third mask suitable for forming a third resist mask exposing an area comprising the source area, the drain area and the portion of the PMD layer that covers the channel area, for implanting dopant elements of the second type in the exposed area,
a fourth mask suitable for forming a fourth resist mask exposing the gate area, for implanting dopant elements of the first type in the gate area.

According to one embodiment of the method, the step of forming a well of the first doping type isolated from the substrate by material of the second doping type comprises the steps of:
forming a mask layer on the substrate, leaving one area of the substrate exposed,
in a series of implanting steps from various directions, implanting said exposed area with dopant elements of the second type under a tilted angle with respect to the substrate surface, thereby creating a buried well of the second doping type,
implanting the exposed area with dopant elements of the first type, thereby creating the well of the first doping type, isolated from the substrate by the buried well.

According to a specific embodiment of the method described in the previous paragraph, two wells of the first doping type, isolated from the substrate, are created adjacent to each other by forming the mask layer in such a way that it leaves two adjacent areas of the substrate exposed, and the two adjacent areas are simultaneously implanted with dopant elements of the second type under the tilted angle, so that a well of material of the second doping type is formed between the two adjacent areas, formed by the merger of the buried wells, the two adjacent areas are simultaneously implanted with dopant elements of the first type so that two adjacent wells of the first doping type are formed, a JFET is produced according to the disclosed method in at least one of the adjacent wells of the first doping type, an additional JFET is produced in the well of the second doping type, the additional JFET being complementary to the JFET or JFETs produced in the adjacent wells of first doping type, the complementary JFET being produced together with the JFET or JFETs in the adjacent wells of the first doping type, in a single process sequence.

According to another specific embodiment of the method described in the paragraph before the previous paragraph, two wells of the first doping type are created adjacent to each other, by forming the mask layer in such a way that it leaves two adjacent areas of the substrate exposed, and wherein the mask layer is furthermore produced in such a way that it leaves an additional area of the substrate exposed, and:

the two adjacent areas and the additional area are simultaneously implanted with dopant elements of the second type under the tilted angle, so that a well of material of the second doping type is formed between the two adjacent areas, formed by the merger of the buried wells formed under the adjacent areas, and so that a buried well of the second doping type is created under the additional area, that is isolated from the buried wells under the adjacent areas, the two adjacent areas and the additional area are simultaneously implanted with dopant elements of the first type so that two adjacent wells of the first doping type are formed, and a separate well of the first doping type is formed in the isolated buried well, a JFET is produced according to the disclosed method in the separate well of the first doping type, an additional JFET is produced in the well of the second doping type, the additional JFET being complementary to the JFET produced in the separate well of first doping type, the complementary JFET being produced together with the JFET in the separate well of the first doping type, in a single process sequence.

The disclosed technology is equally related to a semiconductor substrate comprising a first well of a first doping type, isolated from the substrate by material of a second doping type that is opposite to the first, the first well comprising a junction field effect transistor, the JFET comprising:

a source, a drain and a channel, formed of material of the second doping type, the channel extending between the source and drain, a gate formed of material of the first doping type, metal contacts on the source, drain and gate, a PMD layer on the channel, wherein the same doping profile is present in the source, in the drain and in the stack formed by the channel and the PMD layer.

According to an embodiment of the disclosed substrate, the first well of the first doping type is isolated from the substrate by a buried well of material of the second doping type.

According to a specific embodiment of the substrate described in the previous paragraph, the substrate comprises a second well of the first doping type, isolated from the substrate by a buried well of the second doping type, the second well being adjacent to the first well, and separated from the first well by a well of the second doping type (formed by the merger of the two buried wells), the well of the second doping type comprising a JFET that is complementary to the JFET in the first well of the first doping type, the complementary JFET comprising:

a source, a drain and a channel, formed of material of the first doping type, the channel extending between the source and drain, a gate formed of material of the second doping type, metal contacts on the source, drain and gate, a PMD layer on the channel, wherein the same doping profile is present in the source, in the drain and in the stack formed by the channel and the PMD layer.

According to another specific embodiment of the substrate described in the paragraph before the previous paragraph, the substrate comprises a second and third well of the first doping type, each isolated from the substrate by buried wells of the second doping type, the second and third well being adjacent to each other and separated by a well of the second doping type (formed by the merger of the two buried wells), the buried wells of the second and third well being isolated from the buried well of the first well, the well of the second doping type comprising a JFET that is complementary to the JFET in the first well of the first doping type, the complementary JFET comprising:

a source, a drain and a channel, formed of material of the first doping type, the channel extending between the source and drain, a gate formed of material of the second doping type, metal contacts on the source, drain and gate, a PMD layer on the channel, wherein the same doping profile is present in the source, in the drain and in the stack formed by the channel and the PMD layer.

According to an embodiment, the portion of the PMD layer on the channel comprises traces of a metal on its top surface.

According to an embodiment, the disclosed substrate is an interposer substrate.

The enclosed figures are illustrative only and not drawn to scale.

DETAILED DESCRIPTION OF CERTAIN ILLUSTRATIVE EMBODIMENTS

Referring to FIGS. 1a to 1e, a process sequence is described for fabricating an n-channel JFET on an interposer substrate using a total of four lithographic masks to produce a total of four resist masks, according to embodiments. This process sequence is a practical embodiment of the method of the disclosed technology. Unless otherwise indicated, the details mentioned in relation to this embodiment are not limiting the scope of the invention.

Figure 1A:
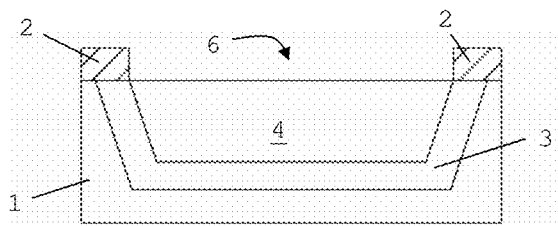
FIGS. 1a to 1e illustrate intermediate structures formed at various stages of fabricating a JFET, according to embodiments.
Figure 1A:
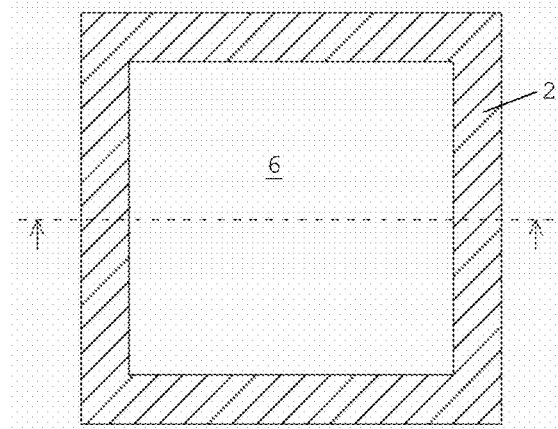

Referring to FIG. 1a, a silicon interposer substrate 1 is provided, according to embodiments. In the exemplary embodiment of the figures, the illustrated substrate 1 is a p-epi wafer, e.g., a silicon p-epi wafer, i.e. a silicon wafer with an epitaxial lightly p-doped silicon layer on its surface. What is indicated as numeral 1 represents this p-doped layer. However, embodiments are not so limited and the substrate 1 can be non-epi p-type wafer, an n-epi wafer or a non-epi n-type wafer, according to other embodiments.

A triple well structure is first created in this wafer 1, by forming a first resist mask 2 on the surface of the wafer. The resist mask may be produced by depositing a resist layer, illuminating it through a lithographic mask, developing the resist and removing the exposed resist. The resist mask 2 covers the substrate while leaving at least one area 6 exposed. A buried n-well 3 is produced by a series of high energy implants of n-type dopants, executed at a tilted angle with respect to the substrate surface, so that the n-dopants are implanted in a region underneath and all around the exposed area 6. For example, if the exposed area 6 is a square, four implants are done at right angles to every side of the square. This results in a buried n-well 3 as shown in the drawing that isolates the exposed area 6 from the surrounding substrate. A 'buried well' of a doping type is generally defined as a well that is at least partially present underneath an area of a substrate (i.e. distanced from the surface of the substrate), isolating said area from the rest of the substrate wherein the buried well is created. This is followed by a high-energy implant of p-type dopants in the exposed area 6, now isolated from the substrate, preferably at an essentially right angle to the substrate surface or at a small angle with respect to the normal of the substrate surface, the resist mask 2 protecting the covered portions of the substrate from the implant. The p-implant creates a p-well 4 isolated from the rest of the substrate by the n-well. After a dopant activation anneal, a triple-well structure is obtained with a single lithographic mask. This is thus the first of the four lithographic masks used in the process for forming a JFET. Further in this specification, an example is given of suitable conditions for creating the buried n-well 3 in the above-described manner.

Figure 1B:
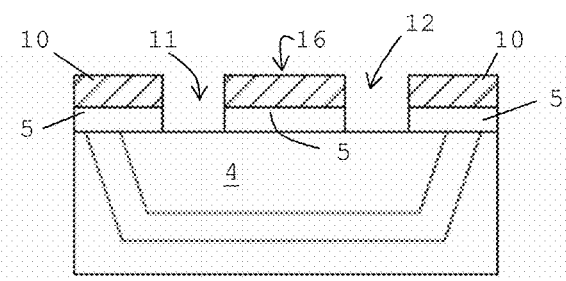
Figure 1B:
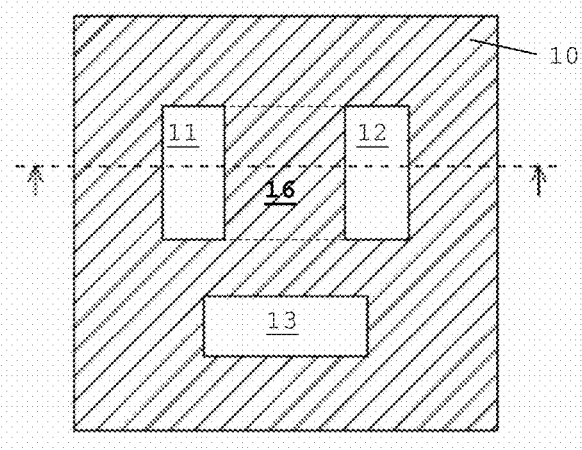

Referring to FIG. 1b, after stripping the resist mask 2, a pre-metal dielectric (PMD) layer 5 is deposited on the substrate. The dielectric material of the PMD layer 5 may be a suitable material adapted for PMD layers, e.g., silicon oxide, silicon nitride or a multilayer of silicon oxide and nitride layers deposited by a suitable deposition technique, e.g., chemical vapor deposition (CVD) for depositing a first layer and physical vapor deposition (PVD) or other for following layers in a multilayer PMD. Within the boundaries of the p-well 4, the PMD layer 5 is patterned by forming a second resist mask 10, defining exposed areas that correspond to a number of designated areas of the p-well 4, defined by their functionality in the JFET: a source area 11, a drain area 12 and a gate area 13. The area 16 between the source and drain areas is designated as the channel area. The contact openings are then etched in the PMD, in the exposed areas. The creation of the second resist mask 10 requires a second lithographic mask.

Figure 1C:
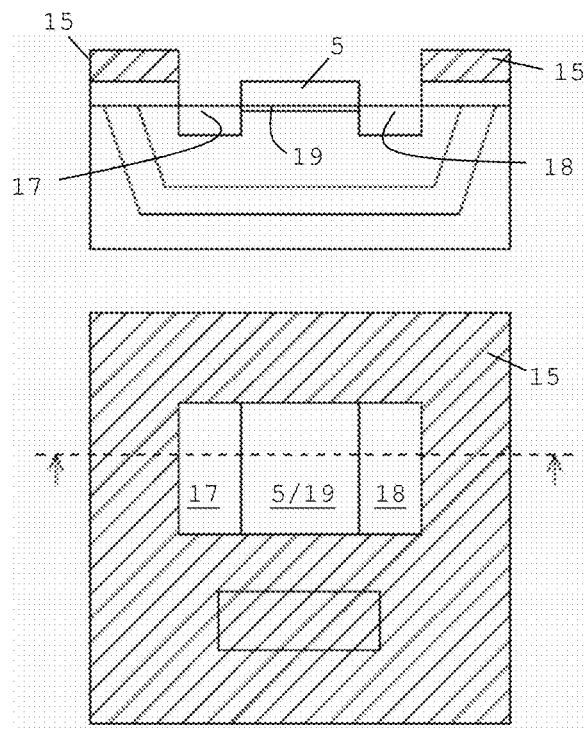

Referring to FIG. 1c, after stripping the second resist mask 10, a third resist mask 15 is produced, according to embodiments. The third resist mask 10 covers the surface of the p-well 4, except for an exposed area including the source and drain areas 11 and 12 of the p-well 4, and the channel area 16 between said source and drain areas, with the channel area 16 covered by the PMD 5. This step requires the third lithographic mask.

According to embodiments of the disclosed method, an n-implant step is performed in the exposed area 11,12 and 16, with n-dopants being injected in the p-well material of the source and drain areas 11, 12, creating an n-doped source 17 and drain 18 respectively, and simultaneously in the channel area 16. The dopant energy and the thickness of the PMD layer 5 are chosen so that dopants are injected through the complete thickness of the PMD layer 5 in the channel area 16, and further into the p-well 4, where an n-doped channel 19 is formed between the source 17 and the drain 18. As the implant takes place through the PMD layer 5, the creation of the source 17 and the drain 18 and the channel 19 is achieved with a single lithographic mask. The implant through the PMD also leads to the fact that the thickness of the channel 19 is lower than the thickness of the source and drain 17/18. As a further consequence of the implant taking place through the PMD, the doping profile, i.e. density of dopant elements as a function of the penetration depth from the surface, is the same in the source 17 and drain 18 on the one hand and in the stack of the PMD 5 and channel 19 on the other. This corresponding doping profile is a typical feature of a JFET fabricated according to the invention.

Figure 1D:
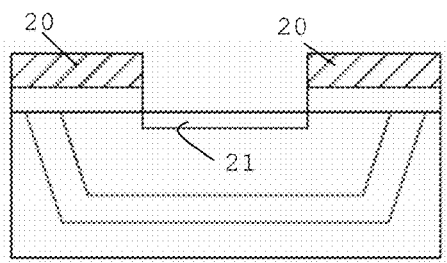
Figure 1D:
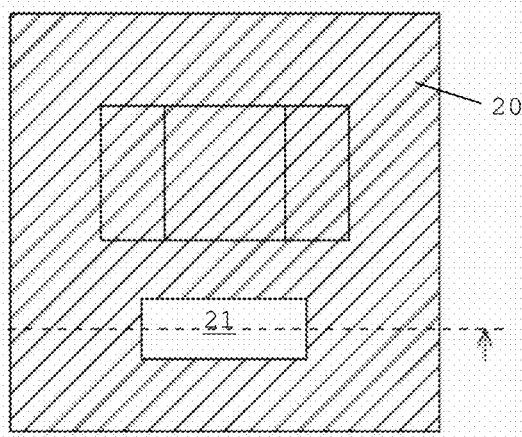

Referring to FIG. 1d, using a fourth lithographic mask, a fourth resist mask 20 is then formed, after stripping the third resist mask 15, according to embodiments. The fourth resist mask 20 covers the p-well 4 except for the gate area 13. A p+ implant is then performed in the gate area 13, thereby creating the p-doped gate 21 of the JFET. As described herein with respect to a JFET, the gate 21 is in fact a portion of the p-well with higher dopant density than the rest of the p-well 4. The whole of the p-well 4 (including gate 21) will act as the gate of the JFET, as the junctions that will become depleted when the JFET is turned off extend between the p-well 4 and the source, drain and channel (17/18/19) and between the p-well 4 and the buried n-well 3. As is clear to the skilled person, the n- and p-type implant steps for creating the source, drain, channel and gate include suitable dopant anneal steps.

This is then followed by the standard steps for completing the JFET which may include a junction anneal, silicidation of the contact areas of source, drain and gate, deposition of metal in the contact areas, stripping the fourth resist mask 20 and further fabrication of intermetal dielectric layers, for example by a single damascene process as generally known in the art. As the silicidation is done after formation of the source, drain and gate openings in the PMD layer 5, the silicidation does not require a silicide blocking mask.

Figure 1E:
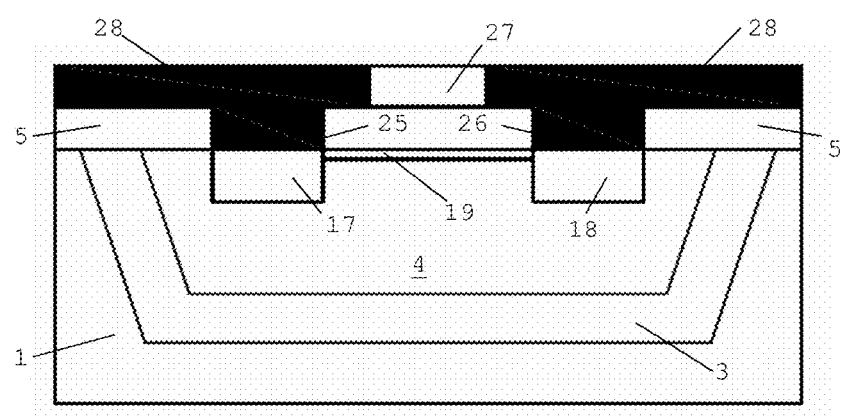

Referring to FIG. 1e, as a result of performing the processes illustrated above with respect to FIGS. 1a-1d, the illustrated JFET is formed, which shows frontal view of a cross section through the source 17 and the drain 18, according to embodiments. Metal contacts 25 and 26 are formed in electrical contact with the source and drain 17/18

(and a contact is also formed with the gate 21, not shown). A second metallization layer is shown, comprising an intermetal dielectric 27 and metal lines 28. According to some embodiments, a JFET fabricated according to embodiments exhibits the same doping profile in the source 17, the drain 18 and the stack formed by the channel 19 and the PMD layer 5. Advantageously, the JFET fabricated using four or less lithographic masks and four or less resist masks 2/10/15/20 according to embodiments may also be recognized by the presence of traces of the metal used for the silicidation, at the interface between the PMD layer 5 and the layers on top of the PMD layer. For example, Ni traces may be detectable if Ni is used for the silicidation step. In the embodiment of FIG. 1, the gate 21 is spaced apart from the source, drain and channel. However the gate area 13 could be placed within the channel area 16, for example at least partially or fully enclosed by the channel area 19. It is clear the channel area 16 or channel 19 is distinct or separated from the gate area 13 or gate 21 respectively.

Figure 2A:
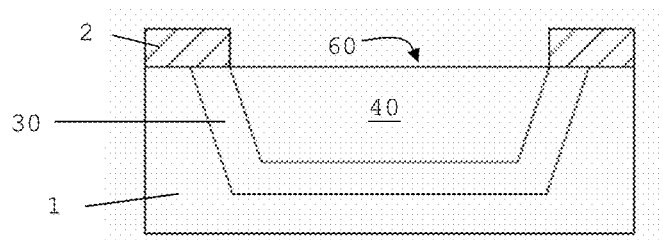
FIGS. 2a to 2e illustrate intermediate structures formed at various stages of fabricating a surface diode together with the JFET in a single process sequence, according to embodiments.
Figure 2B:
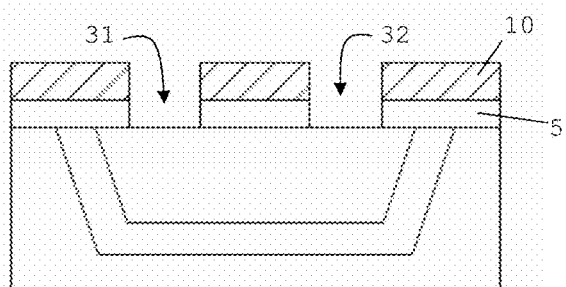
Figure 2C:
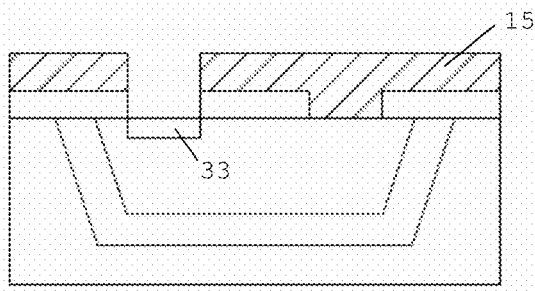
Figure 2D:
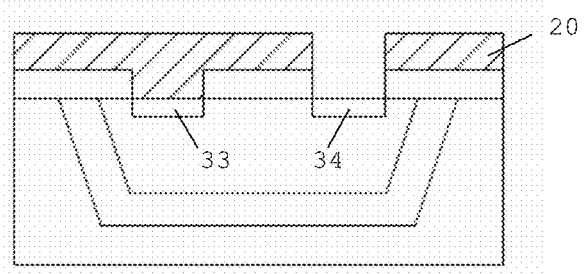
Figure 2E:
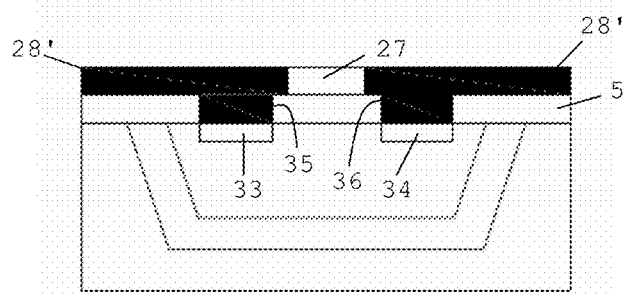

FIGS. 2a to 2e illustrate intermediate structures formed at various stages of fabricating a surface diode together with the JFET in a single process sequence, according to embodiments. It will be appreciated that the process steps described above with respect to FIGS. 1a-1e are suitable for forming other active devices on the interposer substrate 1, different from the JFET. For this reason, fabrication of the JFET according to the disclosure can be incorporated in existing process flows for forming active devices on an interposer, such as diodes and bipolar transistors, according to embodiments. For example, a surface diode can be produced in a second triple-well area defined on the interposer, using the first of the four lithographic masks described above. This is illustrated in FIGS. 2a to 2e. The second triple well area is formed by the buried n-well 30 and the p-well 40 in substrate 1 (FIG. 2a), i.e. formed by a series of tilted n-implants and a p-implant in the exposed area 60 defined by the resist mask 2. This exposed area 60 is produced in the same step as the formation of the exposed area 6 for forming the triple well 3+4 of the JFET, i.e. by a single lithographic mask that defines both exposed areas. The PMD layer 5 is the same layer that is used for the JFET (FIG. 2b). In the p-well 40, the PMD layer 5 is now patterned to form a cathode area 31 and an anode area 32, using the second lithographic mask for forming the second resist mask 10 (FIG. 2b), i.e. the second litho-mask defines the cathode/anode openings and the source/drain/gate openings. The third lithography mask is used to produce the third resist mask 15, which leaves the cathode area exposed (FIG. 2c). This is followed by the implant of n-type dopant elements in the cathode area, thereby creating the cathode 33. This is done by the same implant step that creates the source, drain and channel of the JFET. The fourth lithography mask is used to produce the fourth resist mask 20 which leaves the anode area exposed (FIG. 2d). This is followed by the implant of p-type dopant elements in the anode area, thereby creating the anode 34. This is done by the same implant step that creates the gate of the JFET. Junction anneal, silicidation and contact formation are equally done in the diode area by the same process steps as described above, resulting in the diode as shown in FIG. 2e, provided with contacts 35 and 36. This is followed by the further fabrication of the intermetal dielectric 27 (the same layer as in the JFET process), with metal lines 28' formed therein. A single set of four lithographic masks can thus be used to produce this diode in one well 40 of the substrate and the JFET in another well 4, both devices being fabricated in a single process sequence. This is made possible by the specific feature of the disclosure, according to which the n-implant in the JFET well 4 is done through the complete thickness of the PMD layer 5, to thereby obtain the channel area 19 and the source and drain areas 17/18 of the JFET in a single implant step.

The disclosure is not limited to an n-channel JFET. The description of the fabrication of a p-channel JFET according to the disclosure is obtained by inversing n and p throughout the previous description.

Figures 3A, 3B:
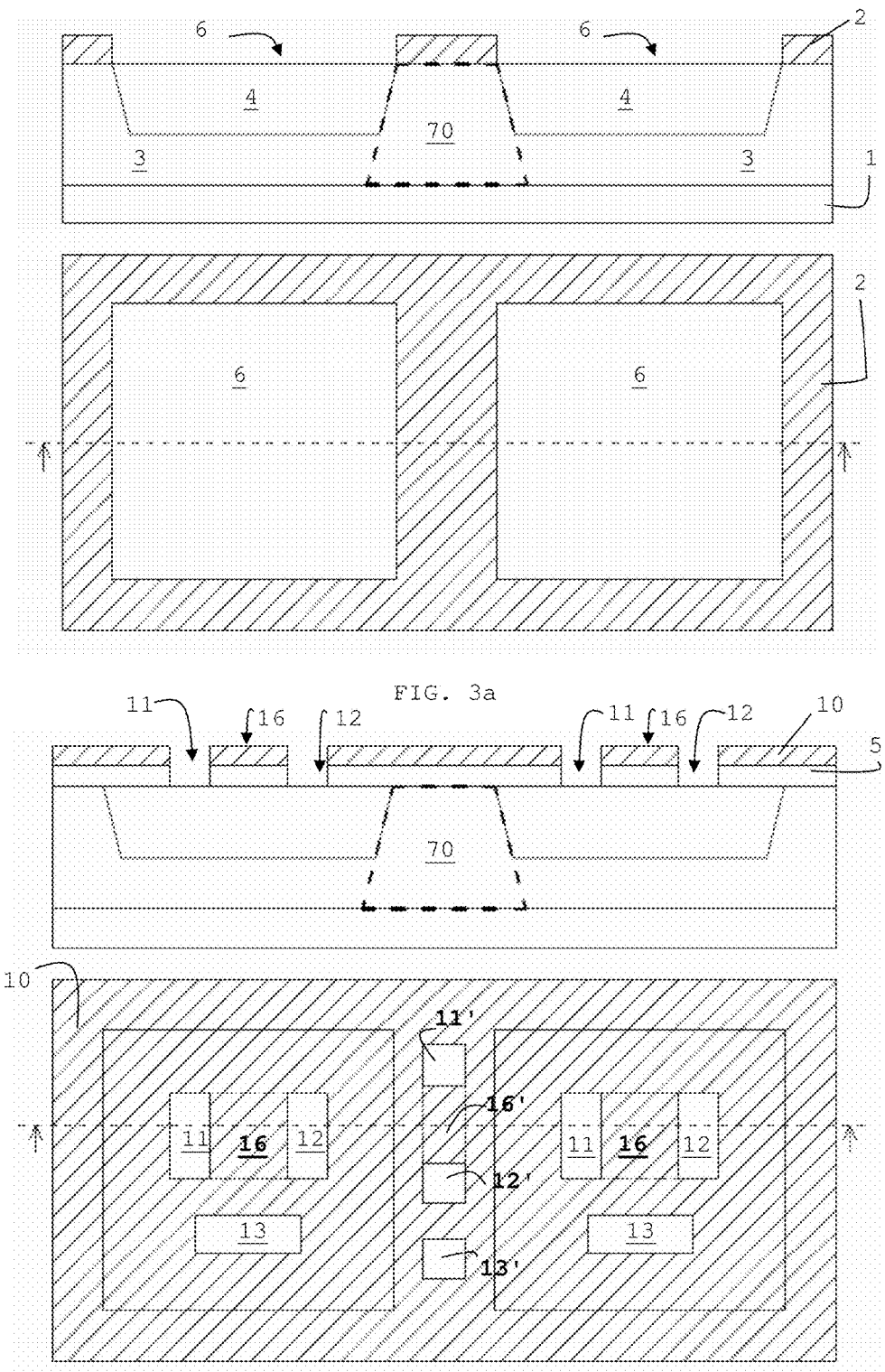
FIGS. 3a to 3d illustrate intermediate structures formed at various stages of fabricating a complementary n-channel and p-channel JFETs, according to embodiments.
Figure 3C:
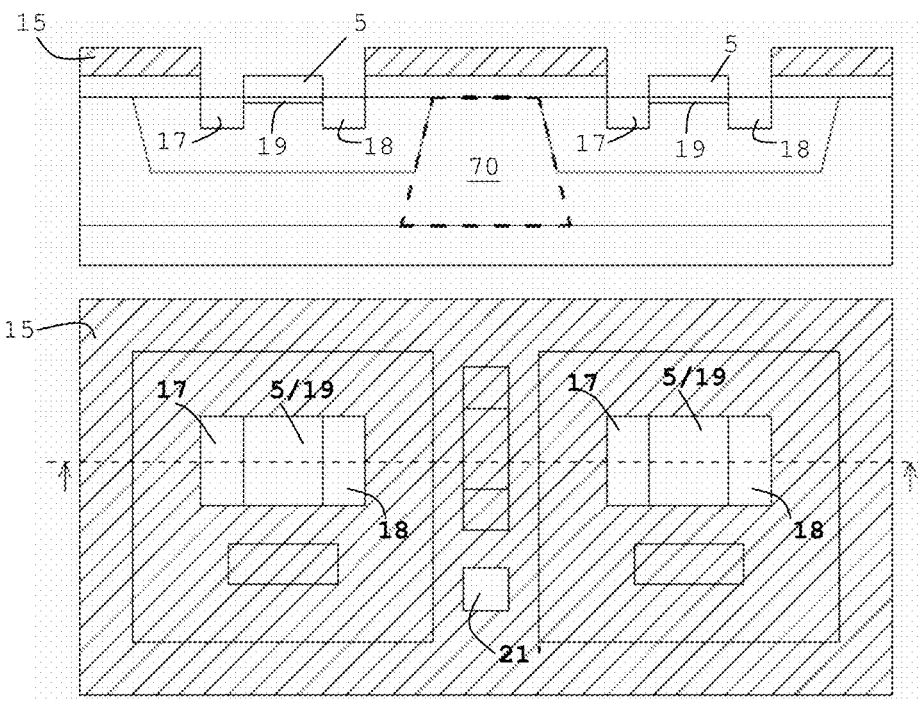
Figure 3D:
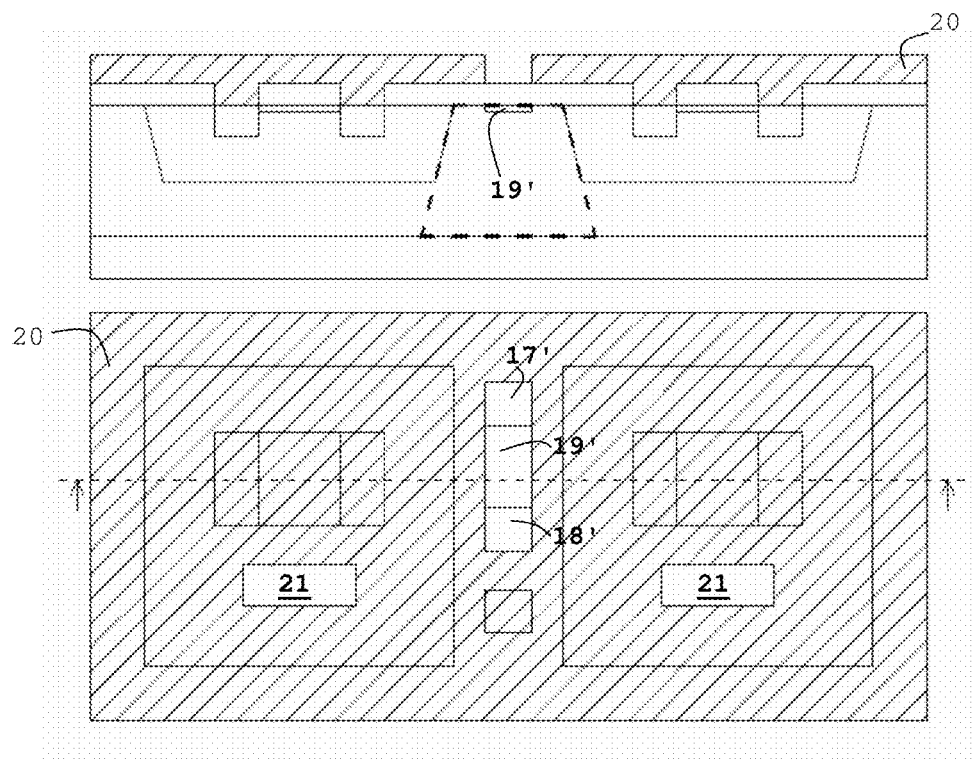

FIGS. 3a to 3d illustrate intermediate structures formed at various stages of fabricating a complementary n-channel and p-channel JFETs, according to embodiments. According to the illustrated embodiment, a complementary p-channel JFET can be produced by the same process sequence described above, i.e. using four or less lithographic masks and four or less resist masks, simultaneously with the n-channel JFET produced in the manner described above. This embodiment involves the use of the tilted implant referred to above, applied to two adjacent areas on the substrate. FIG. 3a shows a front view of two such exposed areas 6, as defined by the first resist mask 2. The substrate 1 is a p-type substrate in the illustrated embodiment. The tilted implant is executed in these two regions simultaneously, resulting in adjacent buried n-wells 3. The tilt angle and implant energies are chosen such that in the region between the exposed areas 6, the two buried n-wells merge to form a standard (i.e. not buried) n-well 70, i.e. an area consisting of n-type material from the surface of the substrate, down to a depth that substantially corresponds to the depth of the buried n-wells 3. Then the p-implant is done in the two exposed areas 6, creating the two p-wells 4. The PMD layer 5 is deposited and patterned in both areas 6 and in the n-well 70 in between, using a single resist mask 10, to form contact openings in source, drain, and gate areas in all three regions, i.e., 2 p-wells and 1 n-well. This is shown in FIG. 3b. Referring to FIG. 3b, source, drain, channel and gate areas 11/12/16/13 are indicated in the p-wells 4 and source, drain, channel and gate areas 17'/12'/16'/13' are indicated in the n-well 70. The resist mask 15 used to implant the source, drain and channel areas to create source, drain and channel 17/18/19 (the latter taking place through the PMD 5) in the p-wells is now designed to implant simultaneously the gate area 13' in the n-well 70, to create the gate 21' of the p-channel JFET (FIG. 3c) Likewise, the resist mask 20 used to implant the gate area 13 in the p-wells 4 to create the gates 21 is now designed to create simultaneously the source, drain and channel 17'/18'/19' (the latter by implanting through the PMD 5), in the n-well 40 (FIG. 3d). Implant activation anneal, junction anneal, silicidation and contact formation takes place in the p-wells 4 and the n-well 70 simultaneously, to arrive at a the substrate comprising two n-channel JFETs in the p-wells 4 and a complementary p-channel JFET in the n-well 70 in between.

Figure 4:
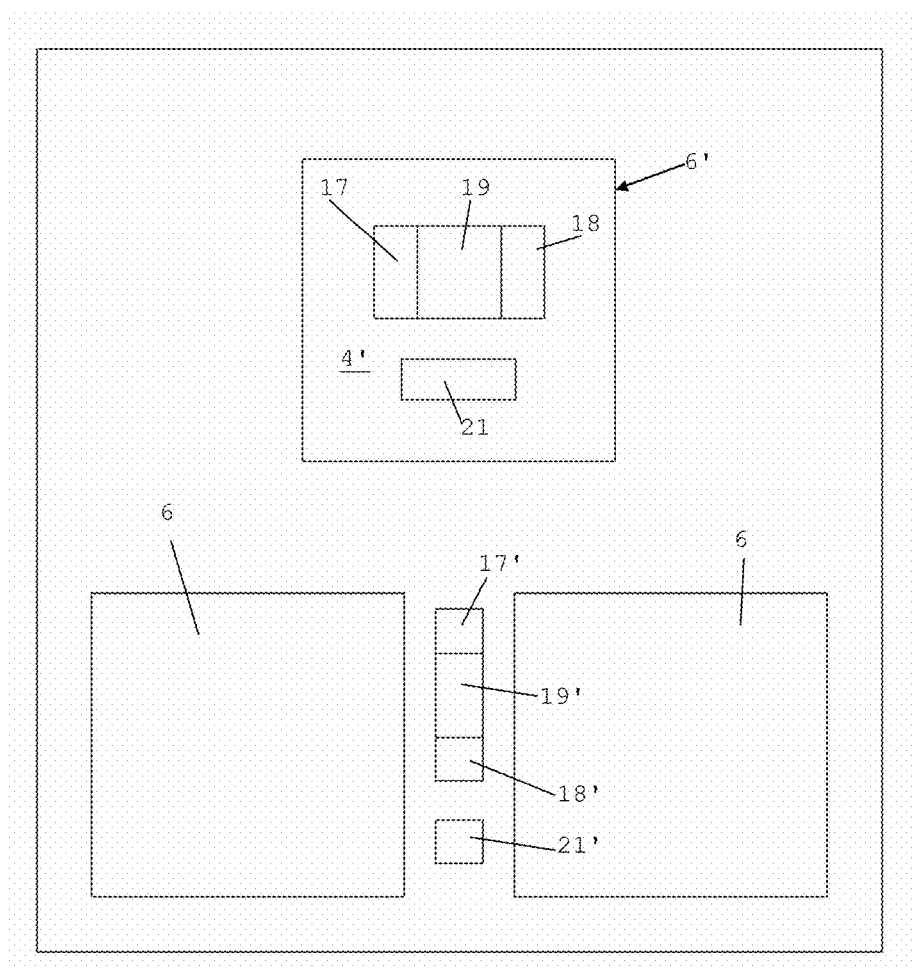
FIG. 4 illustrates a set of complementary JFETs fabricated according to embodiments.

In the embodiment of FIG. 3, an n-channel JFET is produced in one or both of the exposed areas 6 defined by the first resist mask 2. This means that the gates 21 of each of the n-channel JFETs produced in the p-wells 4 and the gate 21' of the p-channel JFET produced in the n-well 70 are connected via the diodes formed by the n-well 70 and the p-wells 4. In some applications this is however undesirable and the gate of two complementary JFETs need to be completely separate. According to another embodiment, this can be achieved without an additional mask by adapting the first lithographic mask used in the process of FIG. 3. FIG. 4 shows an image of the layout of two complementary JFETs according to this embodiment. Numerals 17/18/19/21 and 17'/18'/19'/21' are again used to designate the source/drain/channel/gate of the n-channel JFET and the p-channel JFET respectively. The first resist mask is designed so that it defines at least one additional exposed area 6', at a sufficiently large distance from the two adjacent areas 6 so that in the additional area 6', a buried n-well is produced isolating a p-well 4' from the substrate, wherein this buried n-well is fully isolated from the merged buried n-wells underneath the adjacent areas 6. In the additional area 6', an n-channel JFET is produced according to the above-described steps, simultaneously with the complementary p-channel JFET produced in the n-well 70. In the two adjacent exposed areas 6, additional JFETs or other devices could be produced or these areas may remain unused.

Figure 5:
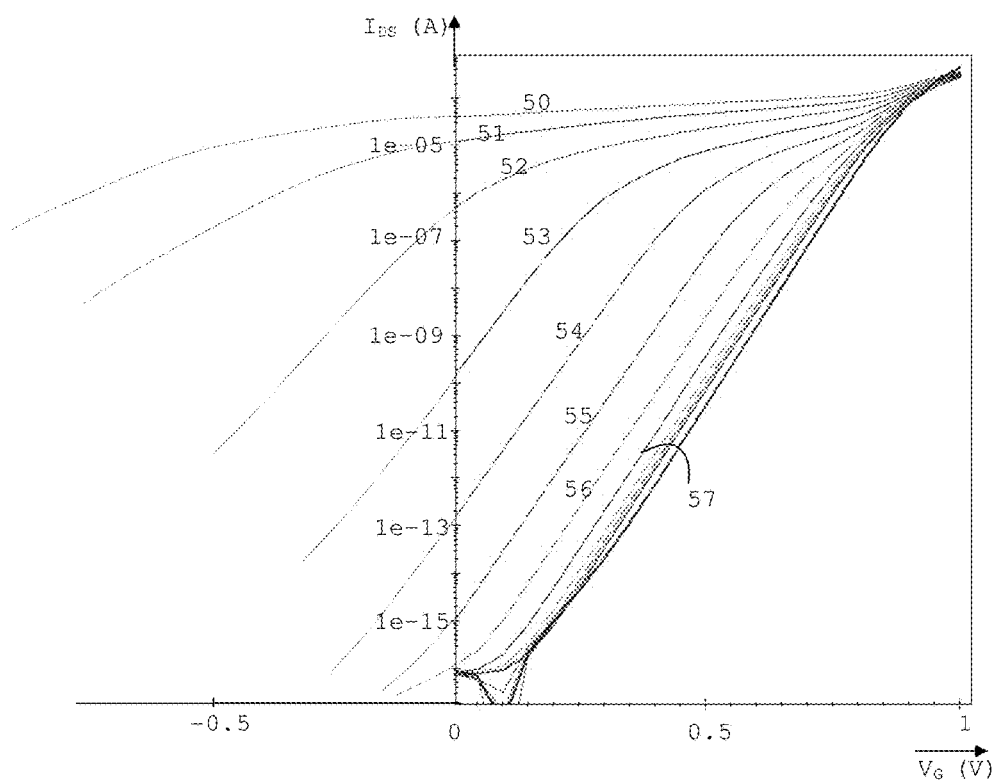
FIG. 5 shows simulated $I_D$-$V_G$ curves of a JFET fabricated according to embodiments.

The PMD layer 5 is configured to have a thickness that allows the channel 19 to be produced by implanting dopant elements through this PMD layer, in such a way that a properly functioning JFET can be produced. FIG. 5 illustrates several $I_{DS}$-$V_G$ curves derived from a simulated model of the n-channel JFET of FIG. 1e, expressing the subthreshold source-drain current $I_{DS}$ as a function of positive values of the gate voltage, for a number of PMD layer thicknesses ranging from 50 nm to 57 nm. The numerical references printed next to a number of curves in FIG. 3 are referring to these PMD thickness values expressed in nm. The simulated implant step for creating the source/drain 17/18 and the channel 19 is a phosphorus ion implant step at an implant energy of 40 keV and an ion implant density of 3e13 cm$^{-2}$. The graph shows that a functional JFET designed to be off at zero gate voltage is possible for PMD thicknesses between about 52 nm to 54 nm. Below these values, the channel 19 is too thick, indicated by the fact that the subthreshold current is too high at zero gate voltage (i.e. the JFET cannot be turned off at 0 gate voltage). Above these values, the channel 19 is too thin, indicated by the fact that the subthreshold source-drain current is comparable or smaller than the drain to gate leakage current. The JFET may be designed to be off at a negative voltage instead of at zero voltage. Extrapolation of the curves shown in FIG. 3 indicates that in that case the PMD thickness is preferably lower, e.g. 50 nm to 52 nm. The example illustrates that it is possible to produce a functioning JFET by the method of the disclosure, by carefully tuning the PMD thickness. The PMD thickness determines the gate voltage at which the JFET is substantially off. This last aspect is characteristic to a specific embodiment of the method wherein the thickness of the PMD is chosen with the aim of obtaining a pre-defined gate voltage at which the JFET is substantially off.

The number of lithographic masks that is used in the creation of the JFET is not a limiting factor in defining the scope of this disclosure. More than four masks may be used if required. For example, the p-well 4 could be created using two masks instead of one: a first mask for creating an n-well, and a second for creating the p-well inside said n-well. Also, the production of active devices on the substrate may include the creation of active areas by a shallow trench isolation process, which would require one or more additional lithographic masks. The use of four masks for forming the JFET as described above does however represent a preferred embodiment of the method, suitable especially for forming the JFET on an interposer substrate.

Example of conditions for forming the triple well structure:
- providing a resist mask (mask 2 in the drawings) of thickness 1.6 μm with a square-shaped exposed area 6 of 6×6 μm,
- tilted n-implant: phosphorus, implanted at an energy of 660 keV, to a dose of 7e12 per square centimeter, at an angle of 40 degrees w.r.t a normal on the substrate surface. The implantation is performed in 4 sub-steps, whereby the wafer is rotated each time by 90 degrees ("4-quadrant implantation"),
- P-well implant: boron, implanted at an energy of 130 keV, to a dose of 1.5e13 per square centimeter, at an angle of 7 degrees w.r.t. a normal on the substrate surface, "4-quadrant implantation",
- Dopant activation anneal (for the wells): temperature=1000° C., time=38 seconds, in a nitrogen atmosphere.

When applied to two adjacent areas as shown in FIG. 3, the conditions given above are capable of creating the n-well 70 between two p-wells 4.

While the disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain features are recited in mutually different dependent claims does not indicate that a combination of these measures cannot be used to advantage. Any reference signs in the claims should not be construed as limiting the scope.

Unless specifically specified, the description of a layer being present, deposited or produced 'on' another layer or substrate, includes the options of
- said layer being present, produced or deposited directly on, i.e. in physical contact with, said other layer or substrate, and
- said layer being present, produced or deposited on one or a stack of intermediate layers between said layer and said other layer or substrate.

What is claimed is:

1. A method of fabricating a junction field effect transistor (JFET), the method comprising:
    providing a semiconductor substrate;
    forming a well of a first dopant type in the substrate, wherein the well is isolated from the semiconductor substrate by an isolation region of a second dopant type that is the opposite of the first dopant type;
    implanting a dopant of the second dopant type at a surface of the well to form a source, a drain and a channel of the JFET;
    implanting a dopant of the first dopant type at the surface of the well to form a gate of the JFET, wherein the gate is entirely formed within the well of the first dopant type;
    prior to implanting the dopant of the first type and the dopant of the second type, patterning a pre-metal dielectric (PMD) layer on the well to form openings in the PMD layer at regions corresponding to the source, the drain and the gate, wherein the PMD layer permanently remains over a region corresponding to the channel and has a thickness such that the channel is formed by implanting the dopant of the first type and the dopant of the second type through the PMD layer; and
    after implanting the dopant of the first type and the dopant of the second type, siliciding the source, the drain and the gate, and forming metal contacts in the contact openings.

2. The method according to claim 1, wherein the thickness of the PMD layer is chosen as a function of a gate voltage at which the JFET is configured to be in a substantially off state.

3. The method according to claim 1, further comprising forming one or more additional wells of the first dopant type, wherein the one or more additional wells are isolated from the substrate by a second isolation region of the second dopant type, and wherein the one or more additional wells are formed simultaneously with the well in which the JFET is formed, and wherein additional devices are formed in the one or more additional wells, together with the JFET, in a single process sequence.

4. The method according to claim 3, wherein the additional devices comprise at least a surface diode.

5. The method according claim 1, wherein four lithographic masks are used consecutively for fabricating the JFET, wherein the four lithographic masks comprise:
a first mask suitable for patterning a first resist mask on the substrate for defining an exposed area in which the well is formed;
a second mask suitable for patterning a second resist mask on the PMD layer for defining exposed areas in which the contact openings are formed;
a third mask suitable for patterning a third resist mask for exposing an area comprising a source area, a drain area and a portion of the PMD layer that covers a channel area for implanting dopants of the second type in the exposed area; and
a fourth mask suitable for patterning a fourth resist mask for exposing a gate area, for implanting dopants of the first type in the gate area.

6. The method according to claim 1, wherein the semiconductor substrate is an interposer substrate.

7. The method according to claim 1, wherein forming the well that is isolated from the substrate by the isolation region comprises:
forming a mask layer on the substrate while leaving an area of the substrate exposed;
implanting the exposed area with a dopant of the second type at a tilted angle with respect to a major surface of the substrate, thereby creating a buried well of the second dopant type; and
implanting the exposed area with a dopant of the first dopant type, thereby creating the well of the first dopant type that is isolated from the substrate by the buried well.

8. The method according to claim 7, wherein two wells of the first dopant type isolated from the semiconductor substrate are created adjacent to each other by forming the mask layer in such a way that the mask layer leaves two adjacent areas of the substrate exposed, wherein:
the two adjacent areas are simultaneously implanted with a dopant of the second dopant type at the tilted angle, such that a well of the second dopant type is formed between the two adjacent areas by a merger of the buried wells;
the two adjacent areas are simultaneously implanted with a dopant of the first dopant type such that two adjacent wells of the first dopant type are formed;
a JFET is formed according to the method of claim 1 in at least one of the adjacent wells of the first dopant type; and
a complementary JFET is formed in the well of the second dopant type and complementary to the JFET, wherein the complementary JFET is formed together with the JFET in the two adjacent wells of the first doping type in a single process sequence.

9. The method according to claim 7, wherein two adjacent wells of the first dopant type are formed by forming the mask layer in such a way that the mask layer leaves two adjacent areas of the semiconductor substrate exposed, and wherein the mask layer is further formed in such a way that it leaves an additional area of the substrate exposed, and wherein:
the two adjacent areas and the additional area are simultaneously implanted with a dopant of the second dopant type at the tilted angle, such that a well of the second dopant type is formed between the two adjacent areas, formed by a merger of the buried wells formed under surfaces of the adjacent areas, and such that a buried well of the second dopant type is formed under surfaces of the additional area that is isolated from the buried wells formed under the surfaces the adjacent areas;
the two adjacent areas and the additional area are simultaneously implanted with the dopant of the first type such that two adjacent wells of the first dopant type are formed, and a separate well of the first dopant type is formed in the isolated buried well;
a JFET is formed according to the method of claim 1 in the separate well of the first dopant type; and
an additional JFET formed in the well of the second dopant type, the additional JFET being complementary to the JFET, the complementary JFET being formed together with the JFET in the separate well of the first dopant type in a single process sequence.

10. A semiconductor device, comprising:
a substrate;
a first well of a first dopant type formed in the substrate, wherein the first well is isolated from the substrate by an isolation region of a second dopant type that is the opposite of the first dopant type, wherein the first well comprises a junction field effect transistor (JFET) formed therein,
wherein the JFET comprises:
a source, a drain and a channel each doped with a dopant of the second dopant type, the channel extending between the source and the drain,
a gate doped with a dopant of the first dopant type, wherein the gate is entirely formed within the first well, metal contacts formed on each of the source, the drain and the gate, and
a pre-metal dielectric (PMD) layer formed on the channel,
wherein doping profiles in the source and the drain are substantially the same, while a doping profile in the channel is shallower than the doping profiles in the source and the drain.

11. The semiconductor device according to claim 10, wherein the first well is isolated from the substrate by a buried well of the second dopant type.

12. The semiconductor device according to claim 11, further comprising a second well of the first dopant type, wherein the second well is isolated from the substrate by a buried well of the second dopant type, wherein the second well is formed adjacent the first well and separated from the first well by a well of the second dopant type, the well of the second doping type comprising a complementary JFET complementary to the JFET in the first well, the complementary JFET comprising:
a source, a drain and a channel each doped with a dopant of the first dopant type, the channel extending between the source and the drain, a gate doped with a dopant of the second dopant type,
metal contacts on each of the source, the drain and the gate, and
a PMD layer formed on the channel,
wherein doping profiles in the source and the drain are substantially the same, while a doping profile in the channel is shallower than the doping profiles in the source and the drain.

13. The semiconductor device according to claim 11, further comprising a second well and a third well each of the first dopant type, wherein each of the second well and the third well are isolated from the substrate by a buried well of the second dopant type, wherein the second and third wells are formed adjacent to each other and are separated by a well of the second dopant type, the buried wells of the second and third wells being isolated from the buried well of the first well, the well of the second dopant type comprising a complementary JFET that is complementary to the JFET in the first well, the complementary JFET comprising:

a source, a drain and a channel each doped with a dopant of the first dopant type, the channel extending between the source and the drain,
a gate doped with a dopant of the second dopant type,
metal contacts on each of the source, the drain and the gate, and
a pre-metal dielectric (PMD) layer formed on the channel,
wherein doping profiles in the source and the drain are substantially the same, while a doping profile in the channel is shallower than the doping profiles in the source and the drain.

14. The semiconductor device according to claim 10, wherein a portion of the PMD layer on the channel comprises traces of a metal on a top surface.

15. The semiconductor device according to claim 14, wherein the traces of the metal comprise traces of nickel.

16. The semiconductor device according to claim 10, wherein the substrate is an interposer substrate.

* * * * *